US006245203B1

(12) United States Patent
Suzuki et al.

(10) Patent No.: US 6,245,203 B1

(45) **Date of Patent: *Jun. 12, 2001**

(54) $BA_XSR_{1-X}TIO_{3-Y}$ TARGET MATERIALS FOR SPUTTERING

(75) Inventors: Ryo Suzuki; Yuichiro Shindo; Tsuneo Suzuki, all of Toda (JP)

(73) Assignee: Japan Energy Corporation, Tokyo (JP)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/162,661

(22) Filed: Sep. 29, 1998

(30) Foreign Application Priority Data

Oct. 1, 1997 (JP) .................................................. 9-283201
Oct. 1, 1997 (JP) .................................................. 9-283202

(51) Int. Cl.[7] .................................................. C23C 14/00

(52) U.S. Cl. ............................... 204/298.13; 204/298.12; 204/192.1; 252/519.1; 252/519.12; 252/520.2

(58) Field of Search ............................ 252/520.2, 519.1, 252/519.12; 204/298.13, 298.72, 192.1

(56) References Cited

U.S. PATENT DOCUMENTS 5,424,707 * 6/1995 Ishikawa et al. ................ 338/22 SD
5,907,470 * 5/1999 Kita et al. ........................... 361/311

FOREIGN PATENT DOCUMENTS 07-003444 1/1995 (JP) .
07-070747 3/1995 (JP) .
07-173621 7/1995 (JP) .

* cited by examiner

*Primary Examiner*—Yogendra Gupta
*Assistant Examiner*—Derrick G. Hamlin
(74) *Attorney, Agent, or Firm*—Akin, Gump, Strauss, Hauer & Feld, L.L.P.

(57) ABSTRACT

A target material for sputtering composed of a perovskite type composite oxide sintered body of the general formula $Ba_xSr_{1-x}TiO_{3-y}$ (where $0 \leqq x<1$ and $0 \leqq y<0.5$), in which the content of each element in the group consisting of Na, K, Mg, Fe, Ni, Co, Cr, Cu, and Al is 1 ppm or less and the content of each element of U and Th is 1 ppb or less. A thin film of $Ba_xSr_{1-x}TiO_3$ deposited by use of the target material exhibits outstanding dielectric properties, reduces the leakage current that has been a problem in the art, and prevents software error. The invention also provides a sputtering target of a sintered body having a relative density of 97% or more and an average grain diameter of 3 $\mu$m or less. It permits the manufacture of thin films with few particle defects and enhanced mechanical strength.

7 Claims, No Drawings

$BA_xSR_{1-x}TIO_{3-Y}$ TARGET MATERIALS FOR SPUTTERING

BACKGROUND OF THE INVENTION

This invention relates to sputtering target materials of perovskite type composite oxide represented by the compositional formula $Ba_xSr_{1-x}TiO_{3-y}$, for use in depositing highly dielectric capacitor thin films of MOS-ULSI by sputtering process. This invention relates, more particularly, to sputtering target materials capable of remarkably decreasing the leakage current in the deposited $Ba_4Sr_{1-x}TiO_3$ thin film or to sputtering target materials capable of forming thin films with a minimum of particle defect and also with enhanced mechanical strength.

Research has in recent years been made on the use of high-dielectric-constant thin films of $SrTiO_3$ and $Ba_xSr_{1-x}TiO_3$ that are obtained by substituting part of the Sr site of $SrTiO_3$ with Ba for the capacitors of semiconductor memories. As a method of depositing such highly dielectric thin films, sputtering is commonly used. In order to impart desirable dielectric properties to the thin films formed by sputtering, a heat treatment to enhance their crystallinity is necessary. In that case, it is known that if the thin films contain alkali metal impurities such as Na and K, crystal growth will force these impurities to come out along the grain boundaries with a consequent increase of leakage current through these impurities. It is also known that U, Th, and other radioactive elements, if present as impurities, will emit alpha rays which can induce software error.

For instance, Japanese Patent Application Kokai No. 7-70747 clarifies that in a target material of a perovskite type titanate compound, what is responsible for leakage current is alkali metal that contributes largely to the migration of charges and teaches that the alkali metal content should be kept 1 ppm or less. It also proposes that the total amount of the radioactive elements such as U and Th that can cause software error by their alpha rays be limited to 10 ppb or less.

Patent Application Kokai No. 7-173621 discloses that on a sintered target material for sputtering composed of $Ba_xSr_{1-x}TiO_{3-y}$ an upper limit of 10 ppm is put to the alkali metal impurity content so that high speed film deposition can be realized.

Patent Application Kokai No. 7-3444 suggests that in order to improve the resistance to cracking due to thermal strain of sintered target materials for sputtering composed of (Ba, Sr)O.$TiO_2$, the total content of inevitable impurities such as Na and Ca, and also Al, Si, and Fe should be 90 ppm or less Other problems associated with $SrTiO_3$ and $Ba_xSr_{1-x}TiO_3$ that is obtained by substituting part of the Sr site of $SrTiO_3$ with Ba are that since these materials tend to give rise to abnormal grain growth during sintering, they can hardly provide sputtering targets of dense structure. Sintering them at higher temperatures for obtaining denser structure will encourage the abnormal grain growth until sintered structures with grain diameters as large as 20 $\mu$m or upwards result. When such a sintered body is used as a sputtering target, a large number of defects known as particles (clusters of minute particulates released from the target) develop on the deposited thin film, resulting in a serious decrease in the yield. Moreover, when sintered bodies are machined to target dimensions, those of low density or large grain size have such low mechanical strength that they present problems of low yield, contamination with impurities, etc.

OBJECTS OF THE INVENTION

In the prior art there has been no clear knowledge yet of the influence upon leakage current of transition metals such as Fe, Ni, Co, Cr and Cu or of impurity elements such as Mg and Al. This invention has for its object to impart enhanced dielectric properties to sputtering target materials of the perovskite type composite oxide sintered bodies represented by the general formula $Ba_xSr_{1-x}TiO_{3-y}$ (where $0 \leqq x<1$ and $0 \leqq y<0.5$) while, at the same time, decreasing the leakage current that has been a problem of the prior art and further preventing the occurrence of software error.

Another object of this invention is to allow such sputtering target materials of the perovskite type composite oxide sintered bodies to produce thin films with far few particle defects than heretofore, simultaneously with enhanced mechanical strength.

No attempt has been made in the art to tackle squarely the problems of particle defect and mechanical strength that arise from the use of the sputtering target materials of the perovskite type composite oxide sintered bodies.

SUMMARY OF THE INVENTION

In view of the above, the present inventors have closely investigated impurities in the target materials for sputtering represented by the compositional formula $Ba_xSr_{1-x}TiO_{3-y}$ so as to decrease the leakage current in highly dielectric thin films of the composition $Ba_{1-x}Sr_xTiO_{3-y}$ deposited by sputtering. As a result we have now found that a remarkable decrease in leakage current in the $Ba_xSr_{1-x}TiO_{3-y}$ film thus deposited is made possible by restricting the contents of alkali metal elements such as Na and K in the target material to 1 ppm or less each and, moreover, limiting the contents of transition metals Fe, Ni, Co, Cr, and Cu and also of Mg and Al to 1 ppm or less each. It has also been found possible to put more strict limitations to the contents of the radioactive elements such as U and Th to 1 ppb or less each than those proposed by Patent Application Kokai No. 7-70747, i.e., a total radioactive element content of 10 ppb or less, so that the software error of semiconductor memories can more positively be precluded.

The present inventors have also searched for means to realize the second object and have just found that the particle defect can be decreased to fewer than one particle per square centimeter and the machining yield be markedly improved by adjusting the relative density of a sintered body of the compositional formula $Ba_xSr_{1-x}TiO_{3-y}$ to 97% or above and also adjusting the grain diameter of the sintered body to 3 $\mu$m or below. High-temperature sintering for close packing usually promotes abnormal grain growth, resulting in a sintered structure of large grain diameters. Nevertheless, this invention has successfully realized the normally incompatible achievements through adequate control of the manufacturing method.

On the basis of the above findings, this invention in its first aspect provides a target material for sputtering composed of a perovskite type composite oxide sintered body of the general formula $Ba_xSr_{1-x}TiO_{3-y}$ (where 0≦x<1 and 0≦y<0.5), characterized in that the content of each element in the group consisting of Na, K, Mg, Fe, Ni, Co, Cr, Cu and Al is 1 ppm or less and the content of each element of U and Th is 1 ppb or less.

This invention in its second aspect provides a target material for sputtering composed of a perovskite type composite oxide sintered body of the general formula $Ba_xSr_{1-x}TiO_{3-y}$ (where 0≦x<1 and 0≦y<0.5), characterized in that the relative density of the sintered body is 97% or above and the average grain diameter of the sintered body is 3 μm or below.

Putting these together, this invention further provides a target material for sputtering composed of a perovskite type composite oxide sintered body of the general formula $Ba_xSr_{1-x}TiO_{3-y}$ (where 0≦x<1 and 0≦y<0.5), characterized in that the content of each element in the group consisting of Na, K, Mg, Fe, Ni, Co, Cr, Cu, and Al is 1 ppm or less and the content of each element of U and Th is 1 ppb or less and that the relative density of the sintered body is 97% or above and the average grain diameter of the sintered body is 3 μm or below.

DETAILED DESCRIPTION OF THE INVENTION (1) A sputtering target material in which the content of each element in the group consisting of Na, K, Mg, Fe, Ni, Co, Cr, Cu, and Al is 1 ppm or less and the content of each element of U and Th is 1 ppb or less:

The manufacture of this target material according to this invention uses, as starting materials, strontium carbonate ($SrCO_3$), or barium carbonate ($BaCO_3$) and strontium carbonate ($SrCO_3$), and titanium oxide ($TiO_2$) powders, in which the contents of alkali metal elements Na and K, transition metal elements Fe, Ni, Co, Cr, and Cu, and Mg and Al are 1 ppm or less each and the contents of radioactive elements such as U and Th are 1 ppb or less each.

Techniques for producing such high-purity powders of $SrCO_3$, $BaCo_3$, and $TiO_2$ are already established. For example, Patent Application Kokai Nos. 9-7751 6 and 9-142839 describe techniques for preparing high-purity strontium carbonate and barium carbonate, respectively. In the case of high-purity strontium carbonate, it can be prepared by adding acid (e.g., nitric or hydrochloric acid) to an aqueous solution containing strontium (e.g., strontium nitrate or strontium chloride) so as to precipitate a strontium salt, isolating the precipitated strontium salt by solid-liquid separation, and then carbonating the strontium salt, e.g., by the addition of a carbonate, preferably ammonium carbonate, or by the injection of carbon dioxide gas. The refining step of dissolving a strontium salt in water and adding an acid may be repeated once or more. Exactly the same applies to barium carbonate. In any case the process is called as recrystallization refining. With TiO2 powder too, a high-purity product is obtained by repeating the refining cycle of distillation, sublimation, and recrystallization and then by firing and pyrolyzing the purified organometallic compound of Ti in air.

In the practice of this invention it is important that every starting material powder be purified to such an extent that its content of each element in the group consisting of Na, K, Mg, Fe, Ni, Co, Cr, Cu, and Al is 1 ppm or less and its content of each element of U and Th is 1 ppb or less.

The starting material powders are weighed in conformity with a given formulation, mixed up through the medium of alcohol or the like, and the mixture is subjected to thermal synthesis to form a single phase of $Ba_xSr_{1-x}TiO_3$. Sintering is carried out by either hot pressing the thermally synthesized $Ba_xSr_{1-x}TiO_3$ powder or by molding the powder in a die or by cold isostatic pressing (CIP) and then sintering it at atmospheric pressure. In order to achieve a relative density of 98% or more, the sintered body obtained by hot pressing or atmospheric pressure sintering is subjected to hot isostatic pressing (HIP). During this working, the sintered body is exposed to low oxygen partial pressure at elevated temperature, with the consequence that oxygen deficiency in the $Ba_xSr_{1-x}TiO_3$ gives a sintered body having electric conductivity. This sintered body is machined to desired configurations as a target material for sputtering.

The sputtering target of the composition $Ba_xSr_{1-x}TiO_{3-y}$ (where 0≦x<1 and 0≦y<0.5) thus produced is used to deposit a thin film of $Ba_4Sr_{1-x}TiO_3$. The thin film exhibits outstanding dielectric properties while, at the same time, showing remarkable reduction of the leakage current that has plagued the industry and, moreover, precluding software error.

(2) A target material of properties such that the relative density is 97% or above and the grain diameter is 3 μm or below:

As starting materials, $BaCo_3$ and/or $SrCO_3$, and $TiO_2$ powders having a purity of 99.9% or more and an average particle diameter of 1 μm or less each are used. These starting material powders are weighed to meet a desired formulation and wet mixed through the medium of alcohol or the like. By thermal synthesis of the mixture at 850–1000° C., a synthesized $Ba_xSr_{1-x}TiO_3$ powder having an average particle diameter of 1 μm or less is obtained.

Sintering methods include hot pressing, a combination of hot pressing and HIP, and atmospheric pressure sintering and HIP.

In the case of hot pressing, the $Ba_xSr_{1-x}TiO_3$ powder with an average particle diameter of 1 μm or less obtained by thermal synthesis is sintered in an Ar atmosphere at 1250–1350° C. and at 15–30 MPa. A sintered body having a relative density of 97% or above and a grain diameter of 3 μm or below is thus obtained. If the sintering temperature exceeds 1350° C. the density increases but abnormal grain growth produces either a crystal structure with a grain diameter of 20 μm or larger or a mixed structure of abnormal and minute grains, both of which reduces the mechanical strength of the product. If the sintering temperature is below 1250° C. a sintered body with a relative density of over 97% cannot be obtained.

When hot pressing and HIP are used in combination, a hot pressing temperature of 1180–1350° C. is used to close the open pores of the sintered surface, and HIP at 1250–1350° C. and at 50 MPa or above is used to give a sintered body having a relative density of 97% or above and a grain diameter of 3 μm or below.

If a sintered body with a relative density of 97% or more is to be obtained by atmospheric pressure sintering, it is necessary to use a long holding time at 1400° C. or above, which causes rapid growth of abnormal grains. A sintered body having a relative density of 97% or above and a grain diameter of 3 μm or below can be obtained by first producing a sintered body with closed pores in the sintered surface and having a relative density of 90–94% by firing at 1350–1450° C. and using an appropriate holding time and then working the sintered body by HIP at 1250–1350° C. and at 50 MPa or more.

During the HIP working the sintered body is exposed to a low oxygen atmosphere at high temperature, and the consequent oxygen deficiency gives a $Ba_{1-x}Sr_xTiO_{3-y}$ sintered body having electric conductivity.

Thus, with a sputtering target material consisting of a perovskite type composite oxide sintered body of the general formula $Ba_xSr_{1-x}TiO_{3-y}$ (where $0 \leqq x < 1$ and $0 \leqq y < 0.5$), it is possible for the sintered body to achieve a relative density of 97% or more and a grain diameter of 3 μm or less. The sintered body so obtained is then machined to the shape of a sputtering target material.

The sintered body of the composition $Ba_xSr_{1-x}TiO_{3-y}$ with a relative density of 97% or more and a grain diameter of 3 μm or less thus made by the afore-described method is markedly improved in the yield of manufacture of sputtering targets. The $Ba_xSr_{1-x}TiO_3$ thin films deposited using the sputtering targets have particle defects of one particle or less per square centimeter, thus strikingly increasing the yield of manufacture of semiconductor memories.

(3) A sputtering target material in which the content of each element in the group consisting of Na, K, Mg, Fe, Ni, Co, Cr, Cu, and Al is 1 ppm or less, the content of each element of U and Th is 1 ppb or less, the sintered body having a relative density of 97% or above and average grain diameter of 3 μm or below:

The manufacture of this target material uses, as starting materials, strontium carbonate ($SrCO_3$), or barium carbonate ($BaCO_3$) and strontium carbonate ($SrCO_3$), and titanium oxide ($TiO_2$) powders in which the contents of alkali metal elements Na and K, transition metal elements Fe, Ni, Co, Cr, and Cu, and Mg and Al are 1 ppm or less each and the contents of radioactive elements such as U and Th are 1 ppb or less each, and also employs the technique already explained in (2) above.

EXAMPLES

The targets according to the present invention and the method of manufacturing the same will be described below in connection with examples of the invention and with comparative examples.

Example 1

$BaCo_3$ and $SrCO_3$ powders to be used as starting materials were obtained, respectively, by recrystallization refining of 99.9%-pure $Ba(NO_3)_2$ and $Sr(NO_3)_2$ until the contents of the elements Na, K, Fe, Ni, Co, Cr, Mg, and Al were decreased to 1 ppm or less each and the contents of the elements U and Th to 1 ppb or less each, and thereafter adding carbon dioxide gas or an aqueous solution of $(NH_4)_2CO_3$ to aqueous solutions of the $Ba(NO_3)_2$ and $Sr(NO_3)_2$. As for the $TiO_2$, a commercially available one having the same level of purity as the $BaCo_3$ and $SrCO_3$ powders was employed.

These material powders were blended in a molar ratio of 1:1:2 and were mixed by wet process in a ball mill using nylon balls and pots, through the medium of ethanol. The resulting mixture slurry was dried and subjected to thermal synthesis in air to give a single phase powder of $Ba_{0.5}Sr_{0.5}TiO_3$. After the addition of an organic binder to the powder, the mixture was preformed using a mold and then CIP worked. To remove the added organic binder, the green compact was degreased in air and fired at ordinary pressure and at 1400° C. for 15 minutes to obtain a sintered body having a relative density of about 95%. The sintered body was further HIP worked under the conditions of 1300° C. for one hour at 100 MPa, and a sintered body with a relative density of about 99% was obtained. This sintered body was machined to desired configurations, whereby a target material 4 in. in diameter and 6 mm thick was made.

Using this target material a film was deposited by the RF sputtering method under the conditions of: substrate temperature: 550° C.; sputter gas pressure: Ar=0.3 Pa and $O_2$=0.1 Pa; and sputter power density=3 W/cm$^2$. The dielectric properties and leakage current of the film were determined. The results are given in Table 1. The thin film formed by the target material of this invention showed a sufficiently low leakage current of less than $1\times10^{-10}$ A/cm$^2$.

Example 1-1

A powder material was synthesized and sintered under the same conditions as used in Example 1 with the exception that 99.9%-pure $BaCo_3$ powder, $SrCO_3$ powder, and $TiO_2$ powder were used as the starting materials. The sintered body obtained by sintering at ordinary pressure had a relative density of about 97%, or slightly higher than the density of the sintered body obtained in Example 1. After HIP, however, the relative density was about 99% or not different from that in the Example 1. This sintered body was machined to desired dimensions to make a sputtering target material.

The target material was used in depositing a film under the same conditions as in Example 1, and the dielectric properties and leakage current of the thin film so obtained were determined. The results are given in Table 1. The dielectric properties of thin film deposited by means of the target material made in this example were not appreciably different from those in Example 1, but the leakage current was as large as $4\times10^{-8}$ A/cm$^2$.

Example 1-2

As starting materials, $BaCo_3$ powder and $SrCO_3$ powder were used which had been obtained, respectively, by recrystallization refining of $Ba(NO_3)_2$ and $Sr(NO_3)_2$ to a level such that the contents of alkali metals Na and K were 1 ppm or less each and the contents of transition metal elements Fe, Ni, Cr, Co and Cu and the contents of the plural component elements of Mg and Al were 1–10 ppm each. For the remainder the same conditions as described in Example 1 were used in synthesizing and sintering a powder material. The relative density of the sintered body that resulted from the sintering at ordinary pressure was about 95%, or approximately the same as that of the sintered body in Example 1. After HIP, the relative density rose to about 99%. This sintered body was machined to given dimensions so as to obtain a target material for sputtering.

The target material was used in depositing a film under the same conditions as in Example 1, and the dielectric properties and leakage current of the thin film so obtained were determined. The results are given in Table 1. The dielectric properties of a thin film deposited by means of the target material made in this example were not significantly different from those in Example 1, but the leakage current of $6\times10^{-10}$ A/cm$^2$ was larger than in Example 1, though it was smaller than in Example 1-1. This indicates the importance of limiting not only the Na and K contents to 1 ppm or less each but also the contents of the elements in the group consisting of Mg, Fe, Ni, Co, Cr, Cu, and Al to 1 ppm or less each.

TABLE 1

| | Relative dielectric constant $\epsilon r$ | Dielectric loss tan $\delta$ | Leakage current (A/cm$^2$) |
|---|---|---|---|
| Example 1 | 252 | 0.018 | $<1\times10^{-10}$ |
| Example 1-1 | 238 | 0.021 | $4\times10^{-8}$ |
| Example 1-2 | 255 | 0.020 | $6\times10^{-10}$ |

Example 2

$BaCo_3$, $SrCO_3$, and $TiO_2$ powders, all having a purity of 99.99% and particle diameter of 1 μm or below, were blended in a molar ratio of 1:1:2 and were mixed by a wet process ball mill using ethanol as a medium. The resulting mixture slurry was dried and subjected to thermal synthesis in air at 1000° C. to obtain a synthetic powder of $Ba_{0.5}Sr_{0.5}TiO_3$. After the addition of an organic binder as a molding assistant to the synthetic powder, the mixture was preformed using a mold and then finally compacted by CIP. To remove the added organic binder, the green compact was degreased in air and sintered in air at 1370° C. for 2 hours to obtain a presintered body having a relative density of about 93%. The presintered body was further HIP worked at 1300° C. for one hour at 100 MPa, and the density, structure, and deflective strength of the sintered body were determined.

Next, a similarly obtained sintered body was machined to the shape of a sputtering target material (4 in. dia. and 6 mm thick). Using this target material a thin film of (Ba, St) $TiO_3$ was deposited by the RF sputtering method under the conditions of: substrate temperature: 550° C.; sputter gas pressures: Ar=0.3 Pa and $O_2$: 0.1 Pa; and sputter power density: 3 W/cm$^2$. The number of particles present on the film thus deposited was counted. The results are given in Table 2.

The sintered body obtained in Example 2 had a fine structure with a relative density of 99.2% and grain diameter of 2.3 μm. Its deflective strength as determined by a three-point bending test was 220 MPa, and there occurred no target cracking during machining.

The number of particles on the thin film deposited by means of the target was as small as 0.2 particle per square centimeter.

Example 2-1

A powder of $Ba_{0.5}Sr_{0.5}TiO_3$ synthesized under the conditions of Example 1 was hot pressed at 1300° C. for 30 minutes at 30 MPa, and the resulting sintered body was evaluated in the same way as described in Example 2.

The sintered body obtained in Example 2-1 had a fine structure with a relative density of 98.9% and grain diameter of 1.6 μm. Its deflective strength as determined by a three-point bending test was 219 MPa, and there was no target cracking during machining.

The number of particles in the thin film deposited by use of the target was as small as 0.4 particle per square centimeter.

Example 2-2

A powder of $Ba_{0.5}Sr_{0.5}TiO_3$ synthesized under the conditions of Example 2 was sintered under two sets of conditions, one at 1300° C. for 10 hours and the other at 1500° C. without holding, to obtain sintered bodies. The sintered bodies were worked by HIP at 1300° C. for one hour and at 100 MPa, and then their density, structure, and deflective strength were determined. The sintered bodies were machined under the same conditions as used in Example 2 to sputtering targets, and the targets were used in depositing thin films, and then the number of particles in the films was counted. Table 2 shows the results.

The sintered body fired at 1300° C. for 10 hours was very fine in structure with an average grain diameter of 1 μm or below. After HIP, however, its relative density was low at 88%, and its deflective strength was below 100 MPa, and cracking occurred during machining to a target. The sintered body sintered at 1500° C. had a comparatively high relative density of about 97%, but its average grain diameter was large at 68 μm, and its deflective strength was low at about 140 MPa. When these target materials were used in depositing thin films, the films obtained showed many particles, both more than 4 particles per square centimeter.

TABLE 2

| | Firing tempera-ture | Density after HIP | Average grain diameter | Deflec-tive strength | Number of particles |
|---|---|---|---|---|---|
| EX. 2 | 1370° C. | 99.2% | 2.3 μm | 220 MPa | 0.2/cm$^2$ |
| Ex. 2-1 | 1300° C. | 98.9% | 1.6 μm | 219 MPa | 0.4/cm$^2$ |
| Ex.2-2 | 1300° C. | 88.2% | <1 μm | 97 MPa | 13.6/cm$^2$ |
| | 1500° C. | 96.9% | 68 μm | 141 MPa | 4.7/cm$^2$ |

Effects of the Invention

As has been explained above, according to this invention, the leakage current in a thin film can be markedly decreased and sintered body be precluded by use of a target material represented by the compositional formula $Ba_xSr_{1-x}TiO_{3-y}$ and which contains 1 ppm or less each of alkali metal elements such as Na and K, transition metal elements such as Fe, Ni, Co, Cr, and Cu, and other elements Mg and Al, and 1 ppb or less each of radioactive elements such as U and Th.

Also, according to the invention, making a target material of the compositional formula $Ba_xSr_{1-x}TiO_{3-y}$ with a relative density of 97% or more and an average grain diameter of 3 μm or less achieves enhanced mechanical strength, improved target machining yield, and protection against contamination during working. The use of the target in a sputtering process renders it possible to obtain thin films with very few particle defects.

Hence the semiconductor memories whose films are deposited using the target materials of this invention can be markedly improved in production yield and reliability.

What is claimed is:

1. A target material for sputtering composed of a perovskite type composite oxide sintered body of the general formula $Ba_xSr_{1-x}TiO_{3-y}$ (where $0 \leqq x<1$ and $0 \leqq y<0.5$), characterized in that the content of each element in the group consisting of Na, K, Mg, Fe, Ni, Co, Cr, Cu, and Al is 1 ppm or less and the content of each element of U and Th is 1 ppb or less.

2. A target material for sputtering composed of a perovskite type composite oxide sintered body of the general formula $Ba_xSr_{1-x}TiO_{3-y}$ (where $0 \leqq x<1$ and $0 \leqq y<0.5$), characterized in that the relative density of the sintered body is 97% or above and the average grain diameter of the sintered body is 3 μm or below.

3. A target material for sputtering composed of a perovskite type composite oxide sintered body of the general formula $Ba_xSr_{1-x}TiO_{3-y}$ (where $0 \leqq x<1$ and $0 \leqq y<0.5$), characterized in that the content of each element in the group consisting of Na, K, Mg, Fe, Ni, Co, Cr, Cu, and Al is 1 ppm or less and the content of each element of U and Th is 1 ppb or less and that the relative density of the sintered body is 97% or above and the average grain diameter of the sintered body is 3 μm or below.

4. A method for preparing a dielectric capacitor thin film, said method comprising:

(a) providing a sputtering target comprising a perovskite type composite oxide sintered body of the general formula $Ba_xSr_{1-x}TiO_{3-y}$, wherein $0 \leqq x<1$ and $0 \leqq y<0.5$, and wherein the content of each element in the group consisting of Na, K, Mg, Fe, Ni, Co, Cr, Cu and Al is 1 ppm or less and the content of each element of U and Th is 1 ppb or less; and (b) sputtering said target.

5. A sputtering target consisting essentially of the target material of claim 1.

6. A sputtering target consisting essentially of the target material of claim 2.

7. A sputtering target consisting essentially of the target material of claim 3.

* * * * *